(12) United States Patent
Khwa et al.

(10) Patent No.: US 12,424,298 B2
(45) Date of Patent: *Sep. 23, 2025

(54) CONTROL CIRCUIT, MEMORY SYSTEM AND CONTROL METHOD

(71) Applicant: Taiwan Semiconductor Manufacturing Company, Ltd., Hsinchu (TW)

(72) Inventors: Win-San Khwa, Taipei (TW); Jen-Chieh Liu, Hsinchu (TW); Meng-Fan Chang, Taichung (TW); Tung-Ying Lee, Hsinchu (TW); Jin Cai, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 204 days.

This patent is subject to a terminal disclaimer.

(21) Appl. No.: 18/354,631

(22) Filed: Jul. 18, 2023

(65) Prior Publication Data

US 2023/0360717 A1    Nov. 9, 2023

Related U.S. Application Data

(63) Continuation of application No. 17/408,500, filed on Aug. 23, 2021, now Pat. No. 11,756,645.

(60) Provisional application No. 63/185,366, filed on May 7, 2021.

(51) Int. Cl.
*G11C 29/42* (2006.01)
*G11C 16/10* (2006.01)
*G11C 16/26* (2006.01)
*G11C 29/44* (2006.01)
*G11C 29/12* (2006.01)

(52) U.S. Cl.
CPC ............ *G11C 29/42* (2013.01); *G11C 16/102* (2013.01); *G11C 16/26* (2013.01); *G11C 29/4401* (2013.01); *G11C 2029/1208* (2013.01)

(58) Field of Classification Search
CPC ....... G11C 29/42; G11C 16/102; G11C 16/26; G11C 29/4401; G11C 2029/1208; G11C 29/50; G11C 2029/0411; G11C 11/56; G11C 11/5642; G11C 13/0069; G11C 29/52; G11C 2211/5641; G11C 11/5628; G11C 13/004; G11C 16/10; G11C 13/0002

See application file for complete search history.

(56) References Cited

U.S. PATENT DOCUMENTS

2015/0161001 A1* 6/2015 Cometti .............. G06F 11/1072
                                                       714/773
2017/0148525 A1* 5/2017 Kathawala ............ G06F 11/079
2018/0375611 A1* 12/2018 Myung ................. H04L 1/0068

* cited by examiner

*Primary Examiner* — Mohammed A Bashar
(74) *Attorney, Agent, or Firm* — JCIPRNET

(57) ABSTRACT

A control circuit, a memory system and a control method are provided. The control circuit is configured to control a plurality of memory cells of a memory array. The control circuit comprises a program controller. The program is configured to program a first electrical characteristic distribution and a second electrical characteristic distribution of the memory cells according to error tolerance of a first bit of a data type. A first overlapping area between the first electrical characteristic distribution and the second electrical characteristic distribution is smaller than a first predetermined value.

20 Claims, 10 Drawing Sheets

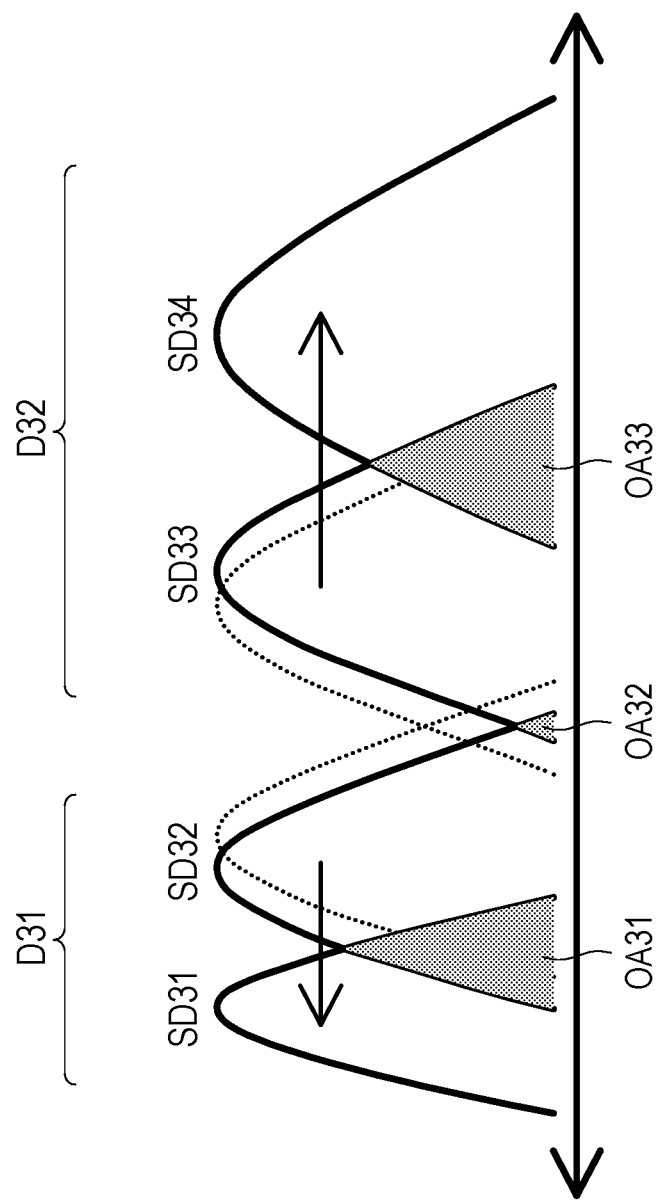

| | Error Tolerance (AU) |
|---|---|
| W5[0] | 1836.7 |
| W5[1] | 654.1 |
| W5[2] | 234.8 |
| W5[3] | 71.5 |
| W5[4] | 23.6 |
| W5[5] | 5.2 |
| W5[6] | 3.2 |
| W5[7] | 1.0 |

CONTROL CIRCUIT, MEMORY SYSTEM AND CONTROL METHOD

CROSS-REFERENCE TO RELATED APPLICATION(S)

This application is a continuation application of and claims the priority benefit of a prior application Ser. No. 17/408,500 filed on Aug. 23, 2021, which claims the priority benefit of U.S. provisional application Ser. No. 63/185,366, filed on May 7, 2021. The entirety of each of the above-mentioned patent applications is hereby incorporated by reference herein and made a part of this specification.

BACKGROUND

In memory applications, sensing margin of each bit is allocated equally. However, the conventional approach somehow may not be the optimized solution for neural network and computing-in-memory (CiM) operation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3 illustrates electrical characteristic distributions of the memory array programmed by the control circuit according to some embodiments of the present disclosure.

FIG. 5 illustrates a table of error tolerances of a weight value with eight bits according to some embodiments of the present disclosure.

DESCRIPTION OF THE EMBODIMENTS

Figure 1:
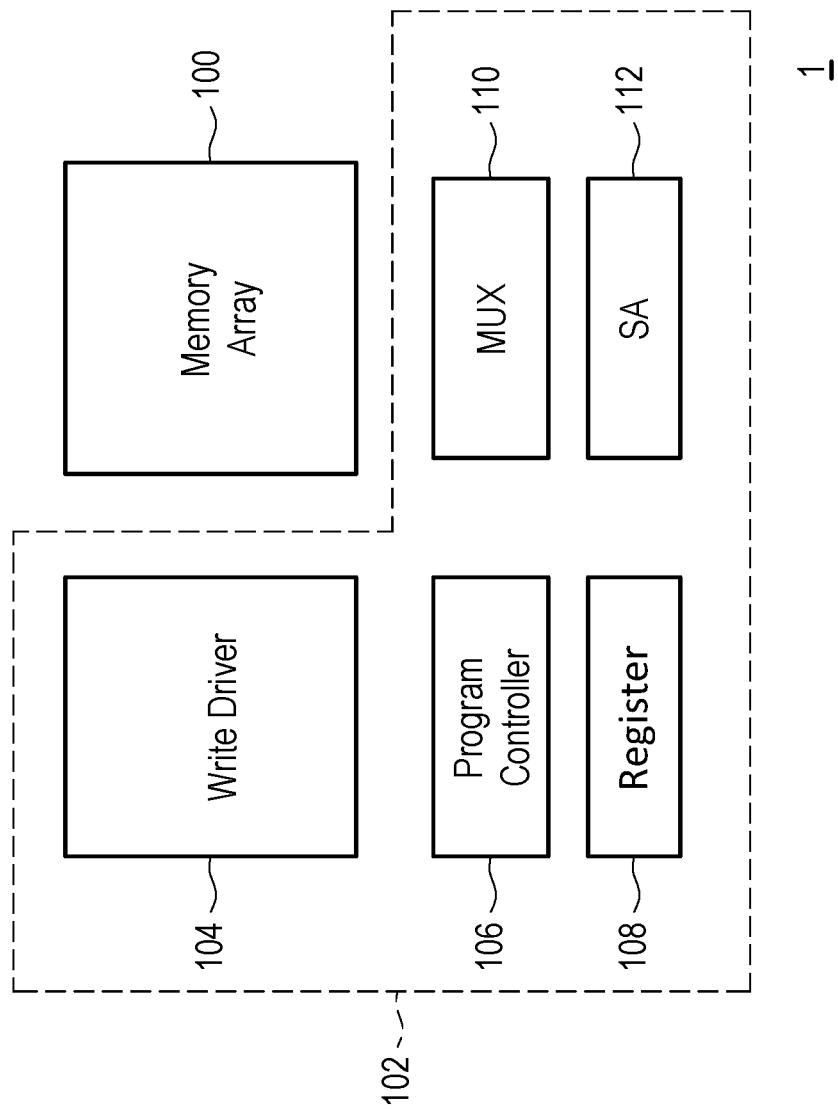
FIG. 1 illustrates a schematic block diagram of a memory system according to some embodiments of the present disclosure.

The following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a schematic block diagram of a memory system 1 according to some embodiments of the present disclosure. The memory system 1 comprises a memory array 100 and a control circuit (also referred as a controller) 102 coupled to the memory array 100. The control circuit 102 is configured to control operations of the memory array 100. The control circuit 102 is configured to perform at least one of a write operation (or a program operation) or a read operation to the memory array 100. In some embodiments, the memory system 1 is integrated and disposed on a single die and being implemented through system on a chip (SOC) manner. In some embodiments, the memory system 1 is included as a part of a larger IC device which comprises circuitry other than the memory system for other functionalities. In some embodiments, the memory system 1 is disposed on at least one chips. For example, the memory array 100 and the control circuit 102 may be disposed different chips.

In the exemplary configuration of FIG. 1, although it is not illustrated, the memory array 100 comprises a plurality of memory cells arranged in columns and rows of the memory array 100. A memory cell may comprise at least one memory element. Electrical characteristics (e.g., resistance or threshold voltage) of each memory element can be programmed in different levels. Therefore, the memory cell is capable of storing data by programming electrical characteristics of the memory element into a corresponding level. In some embodiments, the memory cell in the memory array 100 is a multi-level cell (MLC), a tri-level cell (TLC) a quadra-level cell (QLC), or the like. In some embodiments, a memory system 1 comprising a plurality of described memory cells is configured as an MLC or TLC or QLC memory for storing data. In one or more embodiments, the MLC or TLC or QLC memory is further configured for computing-in-memory (CiM). In at least one embodiment, it is possible to achieve one or more advantages including, but not limited to, larger memory window, better computation performance, or the like.

The memory array 100 includes a plurality of memory cells (not illustrated in FIG. 1) arranged in columns and rows. Electrical characteristic of each memory cell can be programmed to store data. In some embodiments, a resistance or a threshold voltage or other suitable electrical characteristics of the memory cell is programmable to be at different levels.

The memory array 100 further comprises a plurality of word lines, a plurality of source lines, and a plurality of bit lines extending along the columns of the memory array 100. Each of the memory cells is coupled to the control circuit 102 by a corresponding source line, a corresponding bit line, and a corresponding word line. The word lines are configured for transmitting addresses of memory cells, or memory elements in the memory cell, to be read from, and/or to be written to, or the like. The word lines are sometimes referred to as "address lines." The bit lines and/or the source lines are configured for transmitting data to be written to, and/or read from, the memory cells, or memory elements in the memory cell, indicated by the addresses on the corresponding word lines, or the like. The bit lines are and/or the source lines sometimes referred to as "data lines." Various numbers of word lines and/or bit lines and/or source lines in the memory array 100 are within the scope of various embodiments.

Examples of memory elements, which are programmable to have different electrical characteristic values, include, but are not limited to, resistive random access memory (ReRAM or RRAM), magnetic RAM (MRAM), phase change memory (PCM), flash memory comprising charge storage material or floating gate, or the like. Both NOR and NAND gate flash memories are applicable to implement memory elements of the memory cell in one or more embodiments. An RRAM, MRAM or PCM memory element comprises an access transistor electrically coupled in series with a memory layer. The memory layer is programmable to have two or more states corresponding to two or more resistance values of the memory element. The gate of the access transistor of the RRAM, MRAM or PCM memory element corresponds to a control terminal of the memory element, and is electrically coupled to a corresponding word line. A flash memory element comprises a transistor having a floating gate or a charge storage layer. The floating gate or charge storage layer is programmable to store two or more level of charges corresponding to two or more resistance values of the memory element. The gate of the transistor of the flash memory element corresponds to a control terminal of the memory element, and is electrically coupled to a corresponding word line. Other types or configurations of memory elements are also within the scopes of various embodiments.

The control circuit 102 is coupled to the memory array 100. The control circuit 102 is configured to perform at least one of a write operation (or a program operation) or a read operation to at least one memory cell in the memory array 100.

The control circuit 102 is configured to program electrical characteristics of the memory cells. More particularly, the control circuit 102 is configured to program electrical characteristic distributions of the memory cells in the memory array 100 according to the data type stored by the memory array 100. In some embodiments, the data stored by the memory array 100 has multiple bits and error tolerance for each bit is different. The control circuit 102 is configured to program electrical characteristics of the memory array 100 according to error tolerance of each bit.

In some embodiments, the control circuit 102 is configured to program at least one memory cells in the memory array 100 for storing a first bit of the data. Electrical characteristics of the at least one memory cells are programmed by the control circuit 102 into two corresponding levels, and a first electrical characteristic distribution and a second electrical characteristic distribution respectively corresponding to a first value and a second value of the first bit are formed. Moreover, a first overlapping area formed between the first electrical characteristic distribution and the second electrical characteristic distribution is programmed by the control circuit 102 according error tolerance of the first bit of the data. In some embodiments, the first overlapping area is programmed to be less than a first predetermined value according to error tolerance of the first bit of the data.

In at least one embodiment, electrical characteristics of the memory cells are programmed by the control circuit 102 so a ratio of the first overlapping area divided by a total area of the first electrical characteristic distribution and the second electrical characteristic distribution is less than or equal to error tolerance of the first bit of the data. That is, the first predetermined value is a product of the total area of the first electrical characteristic distribution and the second electrical characteristic distribution multiplying error tolerance of the first bit of the data.

In at least one embodiment, the at least one memory cells storing the first bit of the data are programmed by the control circuit 102 to further store a second bit of the data. Electrical characteristics of the at least one memory cells are programmed into four corresponding levels. A first sub-distribution and a second sub-distribution included by the first electrical characteristic distribution, and a third sub-distribution and a fourth sub-distribution included by the second electrical characteristic distribution corresponding to the four levels are formed. The first sub-distribution and the third sub-distribution correspond to the first value of the second bit of the data, and the second sub-distribution and the fourth sub-distribution correspond to the second value of the second bit of the data.

In some embodiments, the control circuit 102 programs the at least one memory cells, so the first overlapping area is less than the first predetermined value calculated based on error tolerances of the first bit and the second bit of the data. Specifically, a second overlapping area is formed by the first sub-distribution and the second sub-distribution, and a third overlapping area is formed by the third sub-distribution and the fourth sub-distribution. The control circuit 102 programs the at least one memory cells, so a ratio of the first overlapping area divided by a sum of the second overlapping area and the third overlapping area is less than or equal a second predetermined value. In some embodiments, the second predetermined value may be a ratio of dividing error tolerance of the first bit of the data by error tolerance of the second bit of the data. That is, the first overlapping area is programmed by the control circuit 102 to be less than or equal to a product (i.e. the first predetermined value) of the second predetermined value and the sum of the second overlapping area and the third overlapping area.

Therefore, electrical characteristics of the at least one memory cells are programmed by the control circuit 102 based to the error tolerance of the stored data type. For example, if a certain bit of the data has a relatively small error tolerance, the electrical characteristic distributions corresponding to the certain bit may be programmed to have smaller overlapping area, thereby reducing bit error rate (BER) of the certain bit.

The control circuit 102 comprises a write driver 104, a program controller 106, a register 108, a multiplexer (MUX) 110, and a sense amplifier (SA) 112. In at least one embodiment, the control circuit 102 further includes one or more clock generators for providing clock signals for various components of the memory system 1, one or more input/output (I/O) circuits for data exchange with external devices, and/or one or more controllers for controlling various operations in the memory system 1.

The write driver 104 is coupled to the memory cells of the memory array 100 through the bit lines and the source lines to perform the write operation to at least one memory cell of the memory array 100. In at least one embodiment, the control circuit 102 further includes a word line driver (also referred as "word line decoder") coupled to the memory array 100 via the word lines. The word line driver is configured to decode a row address of a selected memory cell, selected to be accessed in a read operation or a write operation.

The MUX 110 is coupled to the memory cells of memory array 100 through bit lines to perform the read operation to at least one memory cell of the memory array 100, and the MUX 110 is coupled to the SA 112 through MUX 110. In some embodiments, the MUX 110 selects the bit lines corresponding to the selected memory cell selected by the word line driver for reading.

The SA 112 is coupled to the MUX 110. The SA 112 is configured to receive electrical signals, e.g. voltage or current signals, of the selected memory cell through selection of the MUX 110 to read data stored in the selected memory cell.

The register 108 is coupled to the program controller 106. The register 108 may store configuration data of the memory array 100. For example, the register 108 may store configuration data such as write current and/or read voltage and/or verify threshold voltage, or the like, which is used for programming electrical characteristics of the memory array 100.

The program controller 106 is coupled to the write driver 104, the register 108, the MUX 110 and the SA 112. The program controller 106 is configured to access configuration data stored in the register 108 for controlling the write driver 104, the MUX 110 and the SA to perform at least one of the write operation and the read operation to the memory cells in the memory array 100. Example program controller 106 include, but are not limited to, a central processing unit, a microprocessor, an application specific integrated circuit, a graphics processing unit, a field programmable gate array, an advanced RISC machine or combinations thereof. In addition, the program controller 106 may also be implemented through synthesis using hardware description language (HDL), such as high-speed hardware description language (VHDL), Verilog or the like.

In a write operation, a selected memory cell is configured to be supplied with a write voltage through a corresponding word line. Further, a low voltage is also provided to the selected memory cell through a corresponding bit line and a corresponding source line of by the write driver 104. Therefore, sufficiently large voltage difference is provided to the selected memory cell for performing the write operation. For those unselected memory cells, a high voltage is provided to the corresponding bit lines of the unselected memory cells. Therefore, insufficiently large voltage is received by those unselected memory cells.

In a read operation, the write driver 104 is configured to supply a read voltage to the selected word line. The MUX 110 is configured to select the bit line corresponding to the selected memory cell for reading. The SA 112 is configured to sense data read from the accessed memory cell and retrieved through the selected bit line BL.

In some embodiments, the memory system 1 is configured for performing a computing-in-memory (CiM) operation. The control circuit 102 is configured for writing weight values to the memory array 100 according to error tolerance of each bit of the weight value. Although it is not illustrated in FIG. 1, the control circuit 102 further includes a computing-in-memory (CiM) circuit, coupled to the SA 112. The CiM circuit is configured to perform one or more mathematical and/or logical operations based on the data read from the one or more memory cell and also based on one or more control signals. The one or more control signals is/are received from other internal control circuitry (not shown) in the control circuit 102 and/or from external control circuitry. In some embodiments, the control circuit 102 may further to coordinate one or more mathematical and/or logical operations performed by the CiM circuit with one or more read operations and/or one or more write operations as described herein, to perform one or more computing-in-memory operations. In at least one embodiment, CiM operations are advantageous over other approaches, where data are moved back and forth between the memory and a processor, because such back-and-forth data movement which is a bottleneck to both performance and energy efficiency is avoidable. Examples of CiM applications include, but are not limited to, artificial intelligence, image recognition, neural network for machine learning, or the like. In some embodiments, the CiM circuit is omitted and the memory system 1 is configured for data storage. The described memory system 1 configuration is an example, and other memory device configurations are within the scopes of various embodiments.

Figure 2A:
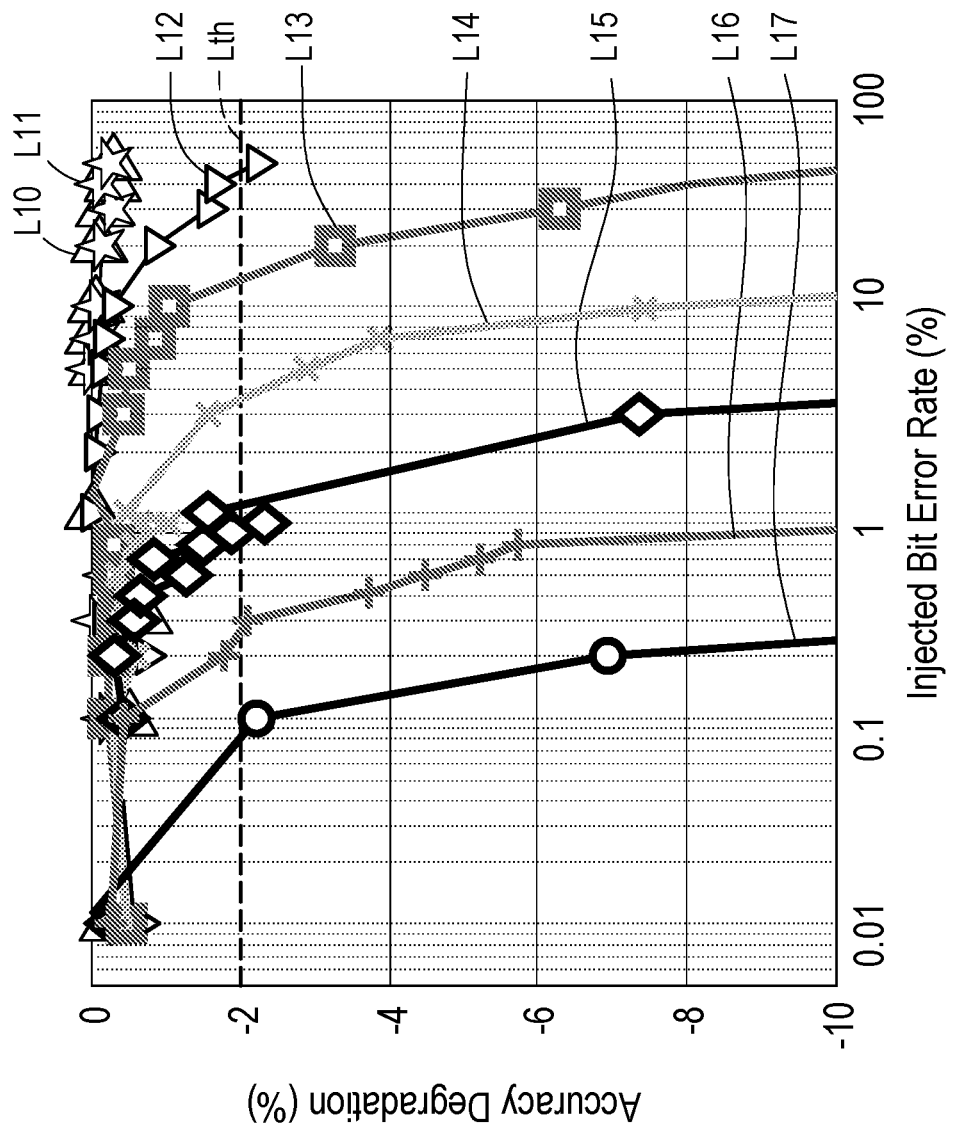
FIG. 2A illustrates relationship curves between injected bit error rate and accuracy degradation of CiM operation according to a first data type.

FIG. 2A illustrates relationship curves L10-L17 between injected bit error rate and accuracy degradation of CiM operation according to a first data type. The first data type may be a weight value with eight bits W1[0:7], which is used for computing-in memory (CiM) in the memory system 1. The weight value is, for example, but not limited to, trained by a ResNet-20 model while using a CIFAR-10 dataset. Other CNN models, such as ResNet-10. MobileNet. DenseNet, ShuffleNet, EfficientNet, or the like, are within the scopes of various embodiments. In FIG. 2A, the horizontal axis shows the bit error rate injected, and the vertical axis shows the accuracy degradation. Curves 10-L17 respectively corresponds to the eight bits W1 [0:7], where W1[0] is a least significant bit (LSB), the W1[7] is a most significant bit (MSB), and W1 [1:6] are central significant bits (CSB). Therefore, the curves L10-L17 show accuracy degradations of the CiM operation that induced by error injected on each of the bits W1 [0:7].

As can be observed in FIG. 2A, with respect to the weight value with eight bits W1[0:7], sensitivities of the CiM operation to BER in each of the bits W1 [0:7] is different. When the injected BER in the bits W1 [0:7] is increased, the accuracy of the bits W1 [0:7] correspondingly degrade. Among the curves 10-L17, the curve L17 has the largest drop, and the curve L10 has the least decline drop. Therefore, when the same amount of error is injected to each of the bits W1 [0:7], the MSB W1[7] will have the most accuracy degradation and the LSB W1[0] has the least. In other words, the CiM operation is the most sensitive to error in the bit W1 [7], while the CiM operation is the most insensitive to error in the bit W1[0].

In addition, in FIG. 2A, a horizontal line Lth is illustrated at a level of 2% of accuracy degradation. The intersection points between the curves L10-L17 with the line Lth represents how much error is tolerated to be injected to each of the bits W1[0:7] when a maximum accuracy degradation of 2% is allowed. Therefore, the intersection points between the curves L10-L17 and the line Lth show error tolerance of each of the bits W1 [0:7] under 2% of error degradation.

Figure 2B:
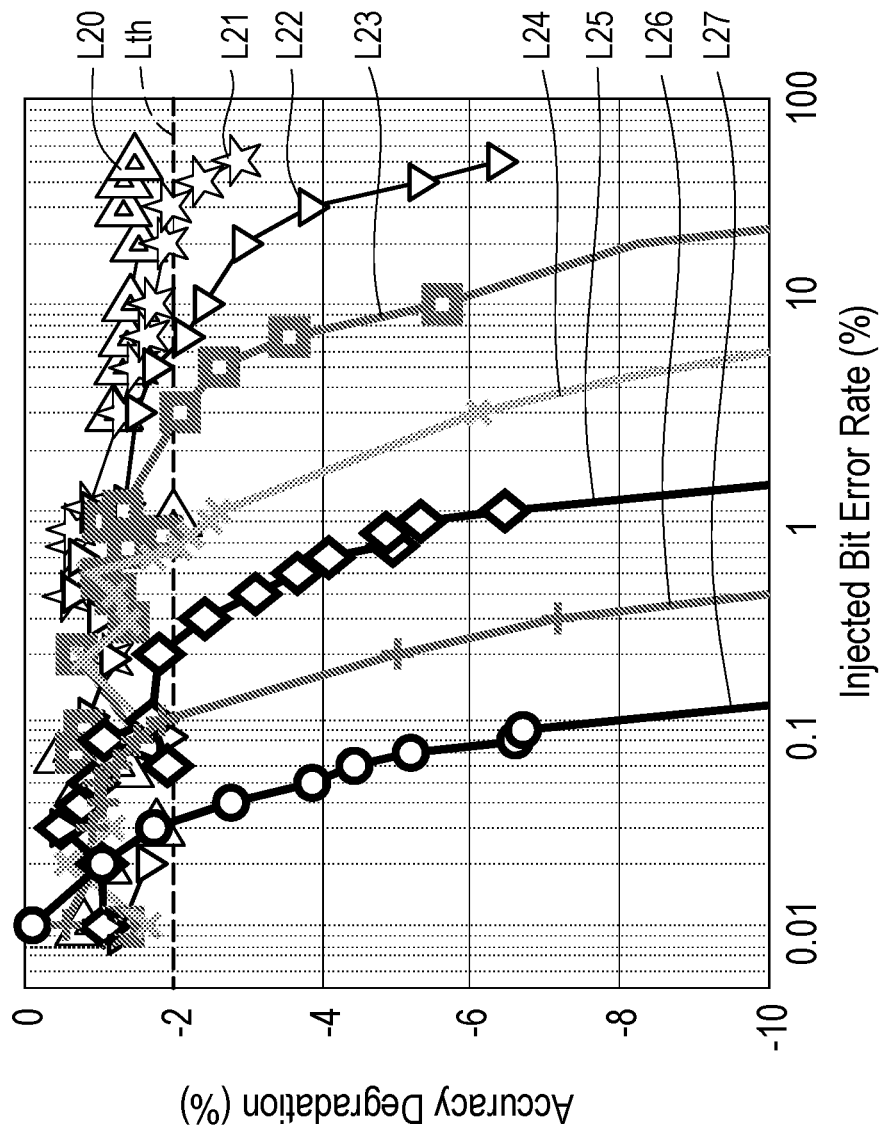
FIG. 2B illustrates relationship curves between injected bit error rate and accuracy degradation of CiM operation according to a second data type.

FIG. 2B illustrates relationship curves L20-L27 between injected bit error rate and accuracy degradation of CiM operation according to a second data type. The second data type may be a weight value with eight bits W2 [0:7], which is used for computing-in memory (CiM) in the memory system 1. The weight value is, for example, but not limited to, trained by a ResNet-20 model while using a CIFAR-100 dataset. Other CNN models, such as ResNet-10. MobileNet. DenseNet. ShuffleNet, EfficientNet, or the like, are within the scopes of various embodiments. In FIG. 2B, the horizontal axis shows the bit error rate injected, and the vertical axis shows the accuracy degradation. Curves L20-L27 respectively corresponds to the eight bits W2 [0:7], where W2[0] is an LSB, the W2[7] is an MSB, and W2 [1:6] are CSB. Therefore, the curves L20-L27 show accuracy degradations of the CiM operation that induced by error injected on each of the bits W2 [0:7].

As can be observed in FIG. 2B, with respect to the weight value with eight bits W2[0:7], sensitivities of the CiM operation to BER in each of the bits W2 [0:7] is different. When the injected BER in the bits W2 [0:7] is increased, the accuracy of the bits W2 [0:7] correspondingly degrade. Among the curves L20-L27, the curve L27 has the largest drop, and the curve L20 has the least decline drop. Therefore, when the same amount of error is injected to each of the bits W2[0:7], the MSB W2[7] will have the most accuracy degradation and the LSB W2[0] has the least. In other words, the CiM operation is the most sensitive to error in the bit W2[7], while the CiM operation is the most insensitive to error in the bit W2[0].

In addition, in FIG. 2B, a horizontal line Lth is illustrated at a level of 2% of accuracy degradation. The intersection points between the curves L20-L27 with the line Lth represents how much error is tolerated to be injected to each of the bits W2 [0:7] when a maximum accuracy degradation of 2% is allowed. Therefore, the intersection points between the curves L20-L27 and the line Lth show error tolerance of each of the bits W2 [0:7] under 2% of error degradation.

Figure 2C:
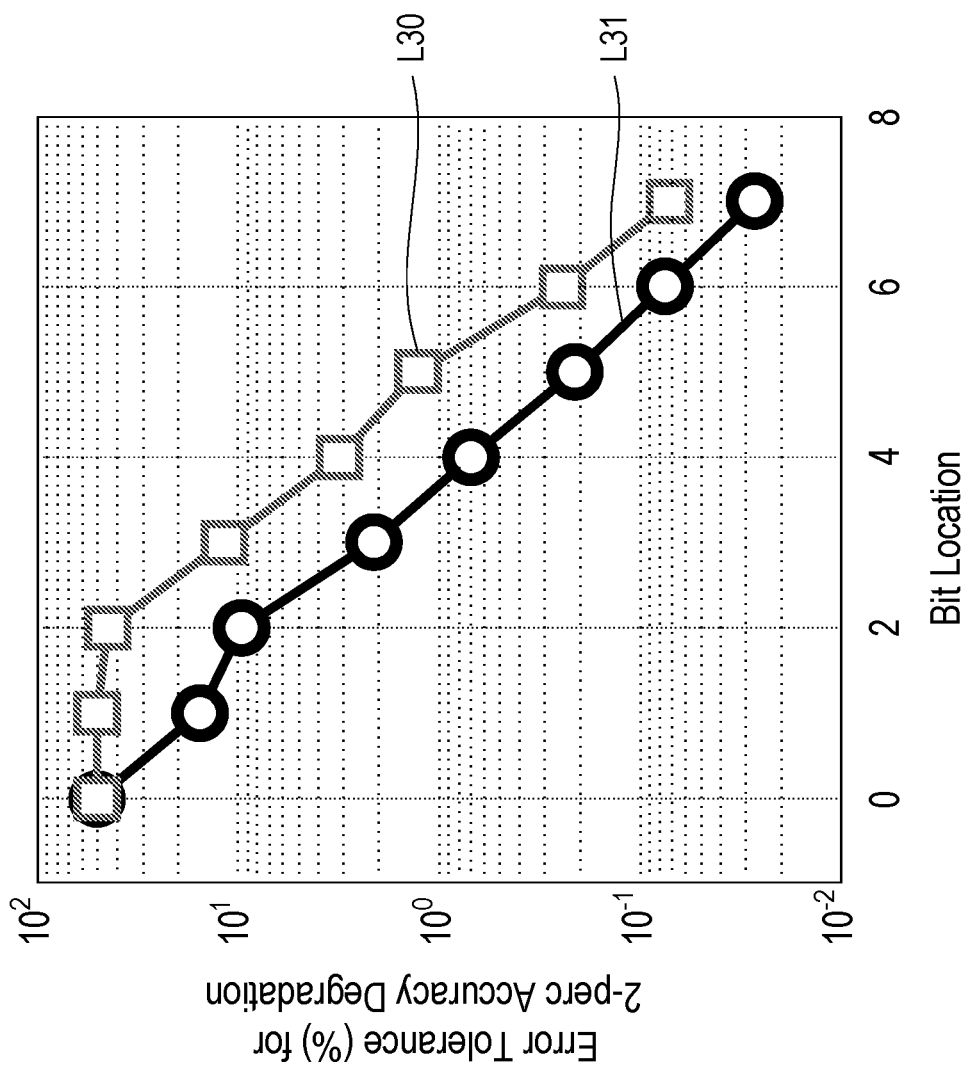
FIG. 2C illustrates curves of error tolerance for 2-percent of accuracy degradation on each of the bits as illustrated in FIGS. 2A and 2B.

FIG. 2C illustrates curves L30, L31 of error tolerance for 2-percent of accuracy degradation on each of the bits W1 [0:7] and W2 [0:7] as illustrated in FIGS. 2A and 2B. In FIG. 2C, the horizontal axis illustrates bit positions of W1 [0:7] and W2 [0:7], and the vertical axis illustrates the error tolerance for 2% of accuracy degradation on each bit of W1 [0:7] and W2 [0:7]. The curve L30 in FIG. 2C corresponds FIG. 2A, and the curve L31 in FIG. 2C corresponds to FIG. 2A. Specifically, the curve L30 in FIG. 2C are plotted using coordinates of the intersection points between the curves L10-L17 with the line Lth in FIG. 2A. The curve L31 in FIG. 2C are plotted using the intersection points between the curves L20-L27 with the line Lth in FIG. 2B. As can be seen in FIG. 2C, the curves L30. L31 are monotonically declination while the bit order increases. For example, in the curve L30. L31, the CiM operation has the highest error tolerance to the LSB W1[0] and W2[0] while the CiM operation has the least error tolerance to the MSB W1[7] and W2[7].

Therefore, according to FIGS. 2A-2C, since binary value information is stored by the weight values, error occurred on the MSB of the weight value results in higher accuracy degradation of the CiM operation than that occurred on other bits of the weight value.

FIG. 3 illustrates electrical characteristic distributions of the memory array 100 programmed by the control circuit 102 according to some embodiments of the present disclosure. In some embodiments, the memory cells in the memory array 100 are MLCs, and the memory system 1 is configured to store weight values with two bits W3 [0:1], where the bit W3[0] is the LSB and the bit W3[1] is the MSB. With respect to each memory cell, there will be four possible electrical characteristic levels where each of the memory cells may be programmed into corresponding to four possible values stored by the weight value. An electrical characteristic of each of the memory cell will be programmed into one of the four levels according to the bits W3 [0:1] to be written. Therefore, there are four electrical characteristic distributions SD31-SD34 formed after the memory cells in the memory array 100 are programmed by the control circuit 102 according to the bits W3 [0:1].

The electrical characteristic distributions SD31-SD32 jointly form an electrical characteristic distribution D31, and the electrical characteristic distributions SD33-SD34 jointly form an electrical characteristic distribution D32. The electrical characteristic distributions SD31-SD34 are commonly referred to herein as sub-distributions. In some embodiments, the electrical characteristic of the memory cells programmed by the control circuit 102 are for example, but not limited to, threshold voltages of the memory cells. Other electrical characteristic of the memory cells, such as resistance, current, or the like, are within the scope of various embodiments.

In some embodiments, the electrical characteristic distributions D31-D32 correspond different digital values of the MSB W3[1] of the weight value. The sub-distributions SD31, SD34 and the sub-distributions SD32, SD33 correspond to different digital values of the LSB W3[0]. The four sub-distributions SD31-SD34 respectively corresponds to for example, but not limited to, four digital values 00, 01, 11, 10 of the bits W3 [0:1]. That is, the electrical characteristic distribution D31 corresponds to digital value 0 of the MSB W3[1], and the electrical characteristic distribution D32 corresponds to digital value 1 of the MSB W3[1]. The sub-distributions SD31. SD34 correspond to digital value 0 of the MSB W3[0], and the sub-distributions SD32, SD33 correspond to digital value 1 of the MSB W3[0]. In some embodiments, the digital values of the bits W3 [0:1] are encoded using Gray code. In such manner, when the value is incremented by 1, only one bit is changed among the bits W3[0:1]. Other encoding methodology of the weight values are within the scope of various embodiments.

As stated in paragraphs related to FIGS. 2A-2C above, the CiM operation has different error tolerance to each bit of weight value, where CiM operation has lower error tolerance to the MSB W3[1] than that of the LSB W3[0]. The electrical characteristic distributions D31-D32 are programmed by the control circuit 102 according to error tolerance of the MSB W3[1]. More specifically, an overlapping area OA32 between the electrical characteristic distributions D31-D32 is programmed by the control circuit 102 according to error tolerance of the MSB W3[1]. Since the electrical characteristic distributions D31. D32 respectively correspond to different digital values of the MSB W3[1] and the overlapping area OA32 is in between of two electrical distributions D31. D32 corresponding to different digital values of the MSB W3 [1], an electrical characteristic of a certain memory cell being programmed within the overlapping area OA32 might cause confusions when identifying digital values of the MSB W3[1], and thus an error might occur. The area size of the overlapping area OA32 corresponds to a possibility on how much an error might occur to the MSB W3[1]. Therefore, the memory array 110 are programmed by the control circuit 102 for the overlapping area OA32 to be less than a first predetermined value.

In some embodiments, a ratio of the overlapping area OA32 divided by a total area of the electrical characteristic distributions D31. D32 is programmed by the control circuit 102 to be less than or equal to error tolerance of the MSB W3[1]. For example, the electrical characteristic distributions D31. D32 are programmed by the control circuit 102, so a ratio of the overlapping area OA32 divided by a total area of the electrical characteristic distributions D31, D32 is less than or equal to error tolerance of the MSB W3 [1] of the data. That is, the first predetermined value is a product of the total area of the electrical characteristic distributions D31. D32 multiplying error tolerance of the MSB W3[1] of the data.

In at least one embodiment, the memory cells are further programmed by the control circuit 102 to store the LSB W3[0] of the data. The sub-distributions SD31. SD34 correspond to for example, but not limited to, digital value 0 of the LSB W3[0], and the sub-distributions SD32. SD33 correspond to for example, but not limited to, digital value 1 of the LSB W3[0], an error might occur to the LSB W3[0] when an electrical characteristic is being programmed within the overlapping areas OA31, OA33. In other words, the overlapping areas OA31, OA33 is in between the sub-distributions corresponding to different digital values of the LSB W3[0]. Thus, an electrical characteristic of a certain memory cell being programmed within the overlapping area OA31, OA33 might cause confusions when identifying digital values of the LSB W3[0], and thus an error might occur. The area size of the overlapping areas OA31, OA33 corresponds to a possibility on how much an error might occur to the LSB W3[0]. Therefore, the memory array 110 are programmed by the control circuit 102 for the overlapping area OA32 to be less than a first predetermined value which is determined based on error tolerance of the bits W3 [0:1].

In some embodiments, when a ratio of error tolerance of the MSB W3[1] divided by error tolerance of the LSB W3[0] is greater than two, the overlapping area OA31 is programmed by the control circuit 102 to be greater than the overlapping area OA32. The overlapping area OA33 is programmed by the control circuit 102 to be greater than the overlapping area OA32.

In some embodiments, a ratio of the overlapping area OA32 divided by a sum of the overlapping areas OA31, OA33 is less than or equal a second predetermined value. In some embodiments, the second predetermined value may be a ratio of dividing error tolerance of the MSB W3[1] of the data by error tolerance of the LSB W3[0] of the data. That is, the overlapping area OA32 is programmed by the control circuit 102 to be less than or equal to a product (i.e. the first predetermined value) of the second predetermined value and the sum of the overlapping areas OA31, OA33.

Therefore, electrical characteristic distributions D31, D32 are programmed by the control circuit 102 based to the error tolerance of the stored data type. Possibilities that an error might occur to a bit with relatively low error tolerance is lowered, thereby reducing BER of the memory system 1.

Figure 4:
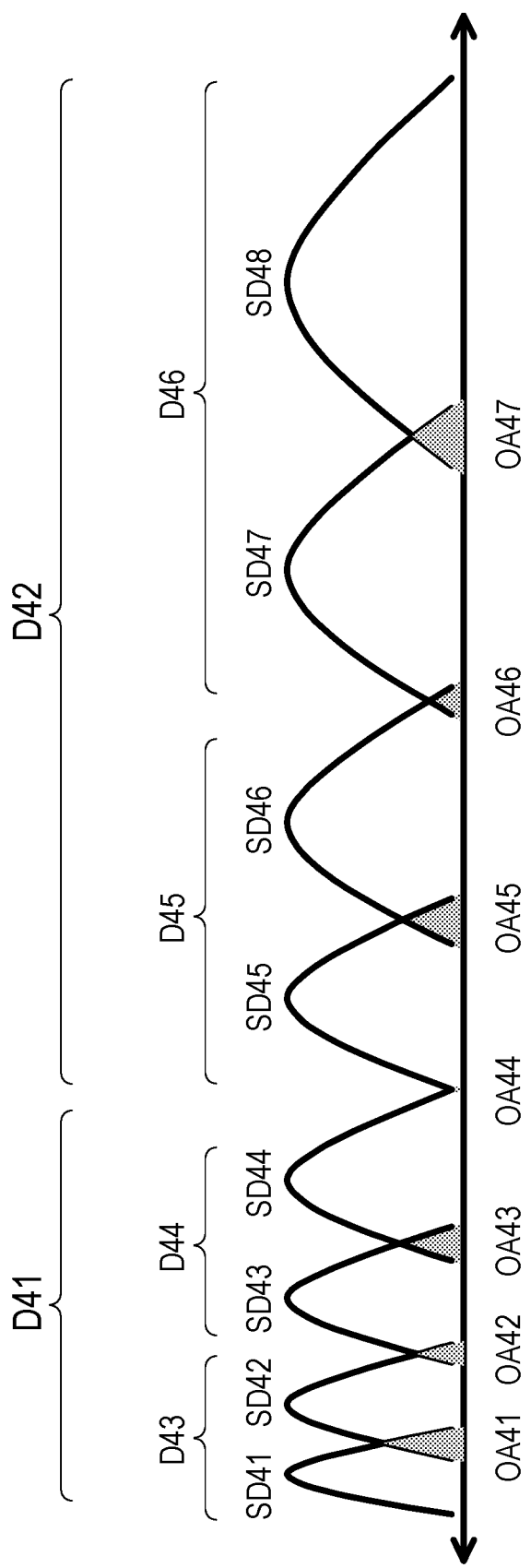
FIG. 4 illustrates electrical characteristic distributions of the memory array programmed by the control circuit according to some embodiments of the present disclosure.

FIG. 4 illustrates electrical characteristic distributions of the memory array 100 programmed by the control circuit 102 according to some embodiments of the present disclosure. In some embodiments, the memory cells in the memory array 100 are TLCs, and the memory system 1 is configured to store weight values with three bits W4 [0:2], where the bit W4[0] is the LSB, the bit W4[1] is the CSB and the bit W4[2] is the MSB. With respect to each memory cell, there will be four possible electrical characteristic levels where each of the memory cells may be programmed into corresponding to four possible values stored by the weight value. An electrical characteristic of each of the memory cell will be programmed into one of the eight levels according to the bits W4 [0:2] to be written. Therefore, there are eight electrical characteristic distributions (also referred as sub-distributions) SD41-SD48 formed after the memory cells in the memory array 100 are programmed by the control circuit 102 according to the bits W4 [0:2].

The sub-distributions SD41-SD44 jointly form an electrical characteristic distribution D41, and the electrical characteristic distributions SD45-SD48 jointly form an electrical characteristic distribution D42. The electrical characteristic distributions SD41-SD42 jointly form an electrical characteristic distribution D43, the electrical characteristic distributions SD43-SD44 jointly form an electrical characteristic distribution D44, the electrical characteristic distributions SD45-SD46 jointly form an electrical characteristic distribution D45, and the electrical characteristic distributions SD47-SD48 jointly form an electrical characteristic distribution D46.

In some embodiments, the eight sub-distributions SD41-SD48 respectively corresponds to for example, but not limited to, four digital values 000, 001, 011, 010, 110, 111, 101, 100 of the bits W4 [0:2]. That is, the electrical characteristic distribution D41 corresponds to digital value 0 of the MSB W4[2], and the electrical characteristic distribution D42 corresponds to digital value 1 of the MSB W4[2]. The electrical distributions D43, D46 correspond to digital value 0 of the CSB W4[1], and the electrical distributions D44, D45 correspond to digital value 1 of the CSB W4[1]. The sub-distributions SD41, SD44, SD45, SD48 correspond to digital value 0 of the LSB W4[0], and the sub-distributions SD42. SD43, SD46, SD47 correspond to digital value 1 of the LSB W4[0]. In some embodiments, the digital values of the bits W4 [0:2] are encoded using Gray code. In such manner, when the value is incremented by 1, only one bit is changed among the bits W4 [0:2]. Other encoding methodology of the weight values are within the scope of various embodiments.

As stated in paragraphs related to FIGS. 2A-2C above, the CiM operation has different error tolerance to each bit of weight value, where CiM operation has lower error tolerance to the MSB W4[2] than that of the LSB W4[0]. The electrical characteristic distributions D41-D42 are programmed by the control circuit 102 according to error tolerance of the MSB W4[2]. More specifically, an overlapping area OA44 between the electrical characteristic distributions D41-D42 is programmed by the control circuit 102 according to error tolerance of the MSB W4[2]. Since the electrical characteristic distributions D41, D42 respectively correspond to different digital values of the MSB W4[2] and the overlapping area OA42 is in between of two electrical distributions D41, D42 corresponding to different digital values of the MSB W4[1], an electrical characteristic of a certain memory cell being programmed within the overlapping area OA44 might cause confusions when identifying digital values of the MSB W4[2], and thus an error might occur. The area size of the overlapping area OA44 corresponds to a possibility of how much an error might occur to the MSB W4[2]. Therefore, the memory array 110 are programmed by the control circuit 102 for the overlapping area OA44 to be less than a first predetermined value.

In some embodiments, a ratio of the overlapping area OA44 divided by a total area of the electrical characteristic distributions D41. D42 is programmed by the control circuit 102 to be less than or equal to error tolerance of the MSB W4[2]. For example, the electrical characteristic distributions D41. D42 are programmed by the control circuit 102, so a ratio of the overlapping area OA32 divided by a total area of the electrical characteristic distributions D41, D42 is less than or equal to error tolerance of the MSB W4[2] of the data. That is, the first predetermined value may be a product of the total area of the electrical characteristic distributions D41, D42 multiplying error tolerance of the MSB W4[2] of the data.

In addition, the electrical distributions D43, D46 correspond to for example, but not limited to, digital value 0 of the CSB W4[1], and the electrical characteristic distributions D44. D45 correspond to for example, but not limited to, digital value 1 of the CSB W4[1], an error might occur to the CSB W4[1] when an electrical characteristic is being programmed within the overlapping areas OA42, OA46. In other words, the overlapping areas OA42, OA46 is in between the sub-distributions corresponding to different digital values of the CSB W4 [1]. Thus, an electrical characteristic of a certain memory cell being programmed within the overlapping area OA42. OA46 might cause confusions when identifying digital values of the CSB W4[1], and thus an error might occur. A total area size of the overlapping areas OA42, OA46 corresponds to a possibility on how much an error might occur to the CSB W4 [1]. In some embodiments, the electrical distributions D43-D46 are programmed by the control circuit 102 according to error tolerances of the MSB W4[2] and the CSB W4[1].

In some embodiments, a ratio of the overlapping area OA44 divided by a sum of the overlapping areas OA42, OA46 is less than or equal a second predetermined value. For example, the second predetermined value may be a ratio of the error tolerance of the MSB W4[2] of the data divided by error tolerance of the CSB W4[1] of the data. That is, the overlapping area OA44 is programmed by the control circuit 102 to be less than or equal to a product (i.e. the first predetermined value) of the second predetermined value and the sum of the overlapping areas OA42, OA46.

Each of the overlapping areas OA41, OA43, OA45, OA47 is in between of two electrical distributions corresponding to different digital values of the LSB W4[0]. Therefore, a total area size of the overlapping areas OA41, OA43, OA45, OA47 corresponds to an error might occur to the LSB W4[0]. In some embodiments, the overlapping areas OA41-OA47 are programmed according to error tolerances of each of the bits W4 [0:2]. For example, a first total area of the overlapping area OA44, a second total area of the overlapping areas OA42, OA46, and a third total area of the overlapping areas OA41, OA43, OA45. OA47 may be programmed by the control circuit 102 according to error tolerance of the MSB W4[2], the CSB W4[1], and W4[0] in respective. In some embodiments, a ratio of the first total area divided by the second total area is programmed to be less than or equal to a ratio of error tolerance of the MSB W4[2] divided by error tolerance of the CSB W4[1], and a ratio of the second total area divided by the third total area is programmed to be less than or equal to a ratio of error tolerance of the CSB W4[1] divided by error tolerance of the LSB W4[0]. In some embodiments, sizes of the first total area, the second total area, and the third total are respectively in proportional to error tolerances of the MSB W4[2], the CSB W4[1], and the LSB W4[0].

Therefore, BER of the bits with relatively low error tolerance can be effectively reduced, thereby improving robustness of neural network against silicon imperfection, such as device variation, noise, and even resistance drift. In addition, retention time to reach a specified inference accuracy degradation are also drastically improved.

FIG. 5 illustrates a table of error tolerances of a weight value with eight bits W5 [0:7] according to some embodiments of the present disclosure. The bit W5[7] is the MSB, the bits W5 [1:6] are the CSBs, and the bit W5[0] is the LSB. The error tolerance shown in FIG. 5 is normalized on the basis of the MSB W4[7]. As can be observed in FIG. 5, error tolerances of the CiM operation to each of the bits increases by bit order. The CiM operation has the lowest error tolerance to the MSB W5[7], and highest to the LSB W5[0].

In some embodiments, when memory cells in the memory array 100 are MLCs, the memory cells can be divided into four memory cell groups. A first memory cell group may be configured to store the bits W5 [0:1], a second memory cell group may be configured to store the bits W5 [2:3], a third memory cell group may be configured to store the bits W5 [4:5], and a fourth memory cell group may be configured to store the bits W5 [6:7] As such, the first memory cell group can be programmed by the control circuit 102 according error tolerances of the bits W5[0:1], the second memory cell group can be programmed by the control circuit 102 according error tolerances of the bits W5 [2:3], the third memory cell group can be programmed by the control circuit 102 according error tolerances of the bits W5 [4:5], and the fourth memory cell group can be programmed by the control circuit 102 according error tolerances of the bits W5 [6:7].

Figure 6:
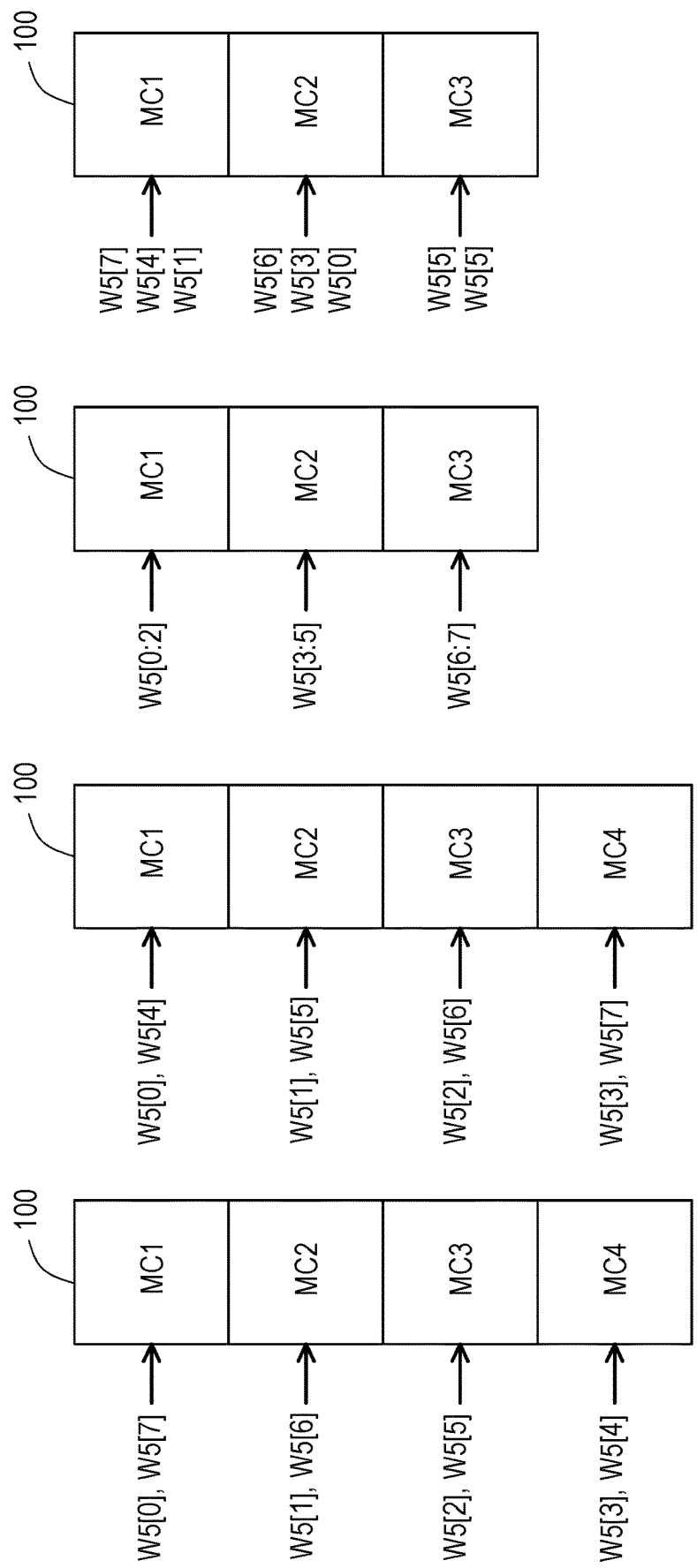
FIGS. 6A-6D illustrate configurations of the weight value with eight bits being stored in the memory array in accordance with some embodiments of the present disclosure.

FIG. 6A illustrates a configuration of the weight value with eight bits W5 [0:7] being stored in the memory array 100 in accordance with some embodiments of the present disclosure. In some embodiments, the memory array 100 is configured to store the weight value with eight bits W5 [0:7] as illustrated in FIG. 5. The memory cells in the memory array 100 are MLCs, and each of the memory cell is configured to store two bits. Therefore, the memory array 100 is divided into four memory cell groups MC1-MC4.

In FIG. 6A, the bits W5 [0:7] are divided into two bit groups BG1, BG2. The bit group BG1 includes the bits W5[0:3] which are the bits with lower bit-orders and higher error tolerances. The bit group BG2 includes the bits W5 [4:7] which are the bits with higher bit-orders and lower error tolerances. Each of the memory cell groups MC1-MC4 stores one bit from the bit group BG1 and another bit from the bit group BG2.

In some embodiments, the memory cell group MC1 stores the bits W5[0] and W5[7], the memory cell group MC2 stores the bits W5[1] and W5[6], the memory cell group MC3 stores the bits W5[2] and W5[5], and the memory cell group MC4 stores the bits W5[3] and W5[4]. Electrical characteristic distributions of the memory cell groups MC1-MC4 may be programmed by the control circuit 102 according to operations stated in paragraphs related to FIG. 3 above, which is omitted herein.

Since the CiM operation has the relatively low error tolerance to the bits W5 [4:7] of the bit group BG2, each of the bits W5 [4:7] in the bit group BG2 are stored in different memory cell groups MC1-MC4. In an exemplary scenario, if a memory cell stores two bits of the bit group BG2 fails, accuracy of the CiM operation may be degraded significantly since the CiM operation is more sensitive to error in the bit group BG2. Therefore, by using the storing configuration as shown in FIG. 6A, the risk of an error simultaneously occurred to two bits in the bit group BG2 can be effectively reduced.

FIG. 6B illustrates a configuration of the weight value with eight bits W5 [0:7] being stored in the memory array 100 in accordance with some embodiments of the present disclosure. In some embodiments, the memory array 100 is configured to store the weight value with eight bits W5 [0:7]

as illustrated in FIG. 5. The memory cells in the memory array 100 are MLCs, and each of the memory cell is configured to store two bits. Therefore, the memory array 100 is divided into four memory cell groups MC1-MC4.

In FIG. 6B, the memory cell group MC1 stores the bits W5[0] and W5[4], the memory cell group MC2 stores the bits W5[1] and W5[5], the memory cell group MC3 stores the bits W5[2] and W5[6], and the memory cell group MC4 stores the bits W5[3] and W5[7]. Electrical characteristic distributions of the memory cell groups MC1-MC4 may be programmed by the control circuit 102 according to operations stated in paragraphs related to FIG. 3 above, which is omitted herein.

In one embodiment, by adopting the configuration as illustrated in FIG. 6B, the memory cells of each of the memory cell groups MC1-MC4 can be programmed according to only one value determined based on error tolerances of the bits W5 [0:7]. For example, a minimum ratio can be determined among the ratios W5[7]/W5[3], W5[6]/W5[2], W5[5]/W5[1], W5[4]/W5[0]. All memory cells of the memory groups MC1-MC4 may be programmed by the control circuit 102 to have similar electrical characteristic distributions. Taking the memory cells of the memory cell group MC1 as an example, a ratio of a first overlapping area respectively corresponding to the bits W5[4]. W5[0] may be programmed to be less than or equal to the minimum ratio. In addition, memory cells in the remaining memory cell groups MC2-MC4 may also be programmed according to the minimum ratio. Therefore, the control circuit 102 may program each of the memory cell groups MC1-MC4 under the same configuration data, and writing operations performed on the memory array 100 are simplified.

FIG. 6C illustrates a configuration of the weight value with eight bits W5 [0:7] being stored in the memory array 100 in accordance with some embodiments of the present disclosure. In some embodiments, the memory array 100 is configured to store the weight value with eight bits W5 [0:7] as illustrated in FIG. 5. The memory cells in the memory array 100 includes MLCs and TLCs. Each of the MLCs is configured to store two bits, and each of the TLCs is configured to three bits. Therefore, the memory array 100 is divided into three memory cell groups MC1-MC3.

In FIG. 6C, the memory cell group MC1 stores the bits W5 [0:2], the memory cell group MC2 stores the bits W5 [3:5], and the memory cell group MC3 stores the bits W5 [6:7]. Electrical characteristic distributions of the memory cell groups MC1-MC2 may be programmed by the control circuit 102 according to operations stated in paragraphs related to FIG. 4 above, and electrical characteristic distributions of the memory cell groups MC3 may be programmed by the control circuit 102 according to operations stated in paragraphs related to FIG. 3, which is omitted herein.

FIG. 6D illustrates a configuration of how the weight value with eight bits W5 [0:7] are stored in the memory array 100 in accordance with some embodiments of the present disclosure. In some embodiments, the memory array 100 is configured to store the weight value with eight bits W5 [0:7] as illustrated in FIG. 5. The memory cells in the memory array 100 includes MLCs and TLCs. Each of the MLCs is configured to store two bits, and each of the TLCs is configured to three bits. Therefore, the memory array 100 is divided into three memory cell groups MC1-MC3.

In FIG. 6D, the memory cell group MC1 stores the bits W5[7]. W5[4], W5[1], the memory cell group MC2 stores the bits W5[6], W5[3], W5[0], and the memory cell group MC3 stores the bits W5[5], W5[2]. Electrical characteristic distributions of the memory cell groups MC1-MC2 may be programmed by the control circuit 102 according to operations stated in paragraphs related to FIG. 4 above, and electrical characteristic distributions of the memory cell groups MC3 may be programmed by the control circuit 102 according to operations stated in paragraphs related to FIGS. 3, which is omitted herein.

Figure 7:
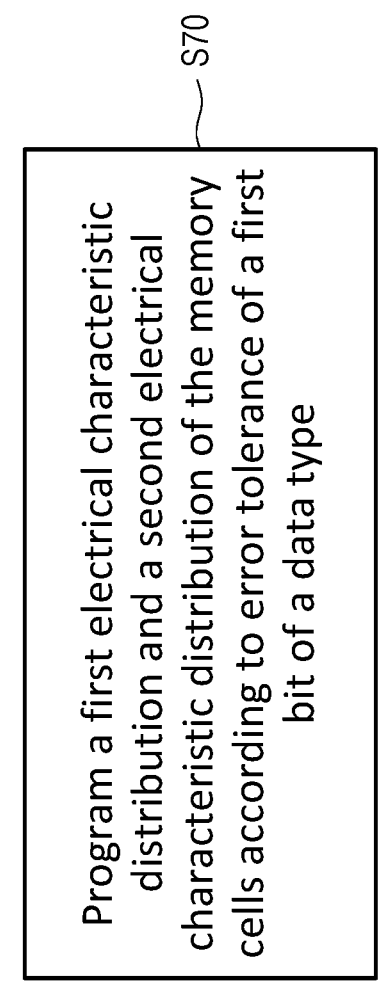
FIG. 7 illustrates a flow chart of a control method in accordance with some embodiments of the present disclosure.

FIG. 7 illustrates a flow chart of a control method in accordance with some embodiments of the present disclosure. The control method may be applied to the control circuit 102 as illustrated in FIG. 1. The control method comprises a step S70.

In step S70, a first electrical characteristic distribution and a second electrical characteristic distribution of the memory cells are programmed by the control circuit 102 according to error tolerance of a first bit of a data type. The first electrical characteristic distribution corresponds to a first digital value of the first bit, and the second electrical characteristic distribution corresponds to a second digital value of the first bit.

In some embodiments, a first overlapping area formed between the first electrical characteristic distribution and the second electrical characteristic distribution is programmed by the control circuit 102 according error tolerance of the first bit of the data. In some embodiments, the first overlapping area is programmed to be less than a first predetermined value according to error tolerance of the first bit of the data.

In at least one embodiment, electrical characteristics of the memory cells are programmed by the control circuit 102 so a ratio of the first overlapping area divided by a total area of the first electrical characteristic distribution and the second electrical characteristic distribution is less than or equal to error tolerance of the first bit of the data. That is, the first predetermined value is a product of the total area of the first electrical characteristic distribution and the second electrical characteristic distribution multiplying error tolerance of the first bit of the data.

In some embodiments, the memory cells are programmed by the control circuit 102 to further store a second bit of the data. Electrical characteristics of the memory cells are programmed into four corresponding levels. A first sub-distribution and a second sub-distribution included by the first electrical characteristic distribution, and a third sub-distribution and a fourth sub-distribution included by the second electrical characteristic distribution corresponding to the four levels are formed. The first sub-distribution and the third sub-distribution correspond to the first value of the second bit of the data, and the second sub-distribution and the fourth sub-distribution correspond to the second value of the second bit of the data.

In some embodiments, the control circuit 102 programs the memory cells, so the first overlapping area is less than the first predetermined value calculated based on error tolerances of the first bit and the second bit of the data. Specifically, a second overlapping area is formed by the first sub-distribution and the second sub-distribution, and a third overlapping area is formed by the third sub-distribution and the fourth sub-distribution. The control circuit 102 programs the memory cells, so a ratio of the first overlapping area divided by a sum of the second overlapping area and the third overlapping area is less than or equal a second predetermined value. In some embodiments, the second predetermined value may be a ratio of dividing error tolerance of the first bit of the data by error tolerance of the second bit of the data. That is, the first overlapping area is programmed by the control circuit 102 to be less than or equal to a product (i.e.

the first predetermined value) of the second predetermined value and the sum of the second overlapping area and the third overlapping area.

Figure 8:
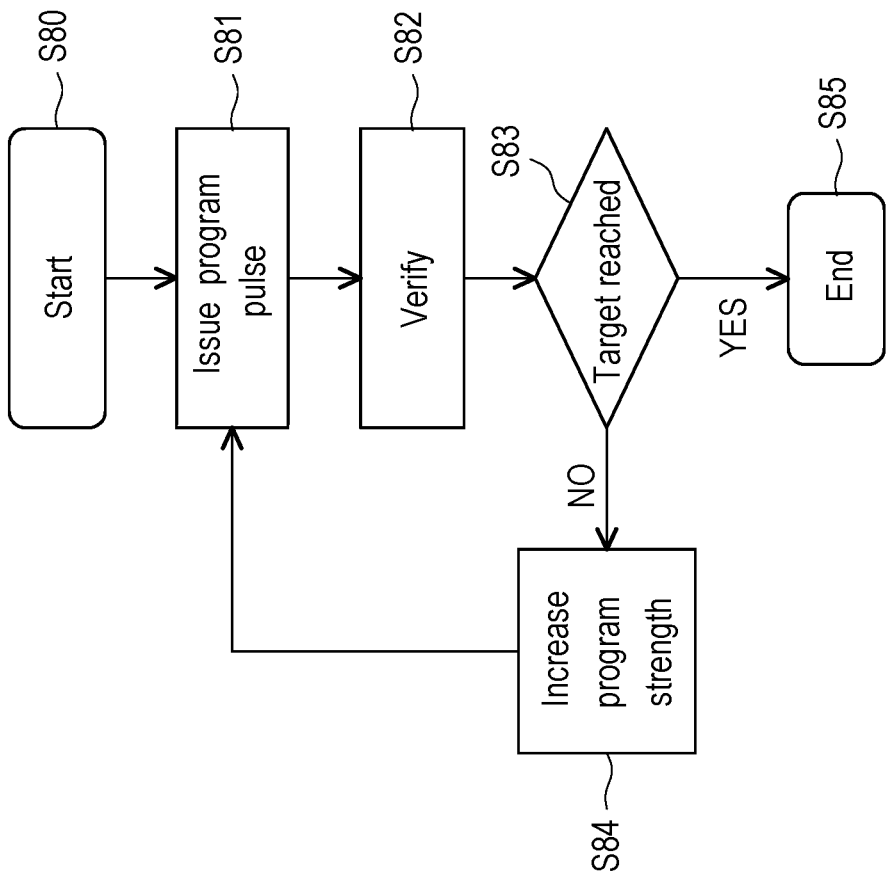
FIG. 8 illustrates a program method of the control circuit in accordance with some embodiments of the present disclosure.

FIG. 8 illustrates a program method of the control circuit 102 in accordance with some embodiments of the present disclosure. The program method may be executed by the control circuit 102 for programming electrical characteristics of the memory array 100. The program method may be an incremental step pulse programming (ISPP) method. The program method may be configured to program threshold voltages of the memory cells. The program method comprises steps S80-S85.

In step S80, the program method is started.

In step S81, a program pulse is issued. Specifically, the program controller 106 controls the write driver 104 to issue a program pulse to a targeted memory cell. When the targeted memory cell receives the program pulse, threshold voltage of the targeted memory cell may be correspondingly increased or decreased.

In step S82, an electrical characteristic of the targeted memory cell is verified. Specifically, the program controller 106 controls the write driver 104 to issue a verify pulse following the program pulse to the targeted memory cell. Then, the program controller 106 controls the MUX 110 and the SA 112 to read a level of the threshold voltage of the targeted memory cell.

In step S83, the level of the electrical characteristic of the targeted memory cell is evaluated by the program controller 106. Specifically, the program controller 106 may access the register 108 to obtain configuration data including information of a targeted level at which the threshold voltage of the target memory cell should be programmed. Then, the program controller 106 may compare the targeted level with the obtained level to evaluate whether the obtained level of the threshold voltage has reached the targeted level.

In step S84, if the obtained level of the electrical characteristic has not reached the targeted level, the program controller 106 may increase the program strength and return to step S81. In other words, for the targeted memory cell which has not reached the target level, the program controller 106 recursively may increase the program strength applied in step S81 for increasing or decreasing the threshold voltage of the memory cell.

In step S85, if the obtained level of the electrical characteristic has reached the targeted level, the program method ends.

Therefore, a control circuit, a memory system and a control method are provided. Electrical characteristics of the memory system are programmed according to error tolerance of the bits stored in the memory cells. Therefore, sensing margins of each bit may be allocated according error tolerance of each bit. BER of the bits with relatively low error tolerance can be effectively reduced, thereby improving robustness of neural network against silicon imperfection, such as device variation, noise, and even resistance drift. In addition, retention time to reach a specified inference accuracy degradation are also drastically improved.

In accordance with an embodiment, a control circuit, configured to control a plurality of memory cells of a memory array is provided. The control circuit comprises a program controller, configured to program a first electrical characteristic distribution and a second electrical characteristic distribution of the memory cells according to error tolerance of a first bit of a data type. A first overlapping area between the first electrical characteristic distribution and the second electrical characteristic distribution is smaller than a first predetermined value.

In accordance with an embodiment, a memory system is provided. The memory system comprises a memory array and a control circuit. The memory array comprises a plurality of memory cells. The control circuit comprises a write driver and a program controller. The write driver is coupled to the memory cells. The program controller is coupled to the write driver. The program controller is configured to program, through the write driver, a first electrical characteristic distribution and a second electrical characteristic distribution of the memory cells according to error tolerance of a first bit of a data type. A first overlapping area between the first electrical characteristic distribution and the second electrical characteristic distribution is smaller than a first predetermined value.

In accordance with an embodiment, a control method for controlling a plurality of memory cells of a memory array is provided. The control method comprises programming a first electrical characteristic distribution and a second electrical characteristic distribution of the memory cells according to error tolerance of a first bit of the data type. A first overlapping area between the first electrical characteristic distribution and the second electrical characteristic distribution is smaller than a first predetermined value.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A control circuit, configured to control a plurality of memory cells of a memory array, the control circuit comprising:
   a program controller, configured to:
      program a first electrical characteristic distribution and a second electrical characteristic distribution of the memory cells according to error tolerance of a first bit of a data type,
   wherein a first overlapping area between the first electrical characteristic distribution and the second electrical characteristic distribution is positively correlated to error tolerance of the first bit of a data type,
   wherein error tolerance of the first bit of the data type is an upper bound of error injected into the first bit of the data type that causes accuracy degradation less than a predetermined threshold.

2. The control circuit of claim 1, wherein the first electrical characteristic distribution and the second electrical characteristic distribution correspond to different digital values of the first bit.

3. The control circuit of claim 1, wherein the program controller is configured to:
   program a first sub-distribution and a second sub-distribution of the first electrical characteristic distribution, and program a third sub-distribution and a fourth sub-distribution of the second electrical characteristic distribution according to a second bit of the data type,
   wherein the first sub-distribution and the fourth sub-distribution correspond to a first digital value of the second bit, the second sub-distribution and the third sub-distribution correspond to a second digital value of the second bit.

4. The control circuit of claim 3, wherein a second overlapping area between the first sub-distribution and the second sub-distribution of the first electrical characteristic distribution is greater than the first overlapping area, a third overlapping area between the third sub-distribution and the fourth sub-distribution of the second electrical characteristic distribution is greater than the first overlapping area.

5. The control circuit of claim 4, wherein a ratio of the first overlapping area divided by a sum of the second overlapping area and the third overlapping area is equal to a ratio between error tolerance of the first bit and the second bit of the data type.

6. The control circuit of claim 3, wherein bits of the data type are divided into a first bit group and a second bit group, wherein error tolerance of each bits in the first bit group is lower than error tolerance of each bits in the second bit group,
wherein the first bit is a bit from the first bit group and the second bit is a bit from the second bit group.

7. The control circuit of claim 6, wherein the memory cells are divided into a plurality of memory cell groups respectively corresponding to a plurality bit pairs of the data type, wherein each of the bit pairs comprises one bit from the first bit group and one bit from the second bit group, wherein the program controller is configured to:
program each of the memory cell groups according to error tolerance of the bit pair which the memory cell corresponds to.

8. A memory system, comprising:
a memory array, comprising a plurality of memory cells;
a control circuit, comprising:
a write driver, coupled to the memory cells; and
a program controller, coupled to the write driver, the program controller configured to:
programming, through the write driver, a first electrical characteristic distribution and a second electrical characteristic distribution of the memory cells according to error tolerance of a first bit of a data type,
wherein a first overlapping area between the first electrical characteristic distribution and the second electrical characteristic distribution is positively correlated to error tolerance of the first bit of a data type
wherein error tolerance of the first bit of the data type is an upper bound of error injected into the first bit of the data type that causes accuracy degradation less than a predetermined threshold.

9. The memory system of claim 8, wherein the first electrical characteristic distribution and the second electrical characteristic distribution correspond to different digital values of the first bit of the data type.

10. The memory system of claim 8, wherein the program controller is configured to:
program a first sub-distribution and a second sub-distribution of the first electrical characteristic distribution, and program a third sub-distribution and a fourth sub-distribution of the second electrical characteristic distribution according to a second bit of the data type, wherein the first sub-distribution and the fourth sub-distribution correspond to a first digital value of the second bit, the second sub-distribution and the third sub-distribution correspond to a second digital value of the second bit.

11. The memory system of claim 10, wherein a second overlapping area between the first sub-distribution and the second sub-distribution of the first electrical characteristic distribution is greater than the first overlapping area, a third overlapping area between the third sub-distribution and the fourth sub-distribution of the second electrical characteristic distribution is greater than the first overlapping area.

12. The memory system of claim 11, wherein a ratio of the first overlapping area divided by a sum of the second overlapping area and the third overlapping area is equal to a ratio between error tolerance of the first bit and the second bit of the data type.

13. The memory system of claim 10, wherein bits of the data type are divided into a first bit group and a second bit group, wherein error tolerance of each bits in the first bit group is lower than error tolerance of each bits in the second bit group,
wherein the first bit is a bit of the first bit group and the second bit is a bit of the second bit group.

14. The memory system of claim 13, wherein the memory cells are divided into a plurality of memory cell groups respectively corresponding to a plurality bit pairs of the data type, wherein each of the bit pairs comprises one bit from the first bit group and one bit from the second bit group, wherein the program controller is configured to:
program each of the memory cell groups according to error tolerance of the bit pair which the memory cell corresponds to.

15. A control method for controlling a plurality of memory cells of a memory array, the control method comprising:
programming a first electrical characteristic distribution and a second electrical characteristic distribution of the memory cells according to error tolerance of a first bit of a data type,
wherein a first overlapping area between the first electrical characteristic distribution and the second electrical characteristic distribution is positively correlated to error tolerance of the first bit of a data type,
wherein error tolerance of the first bit of the data type is an upper bound of error injected into the first bit of the data type that causes accuracy degradation less than a predetermined threshold.

16. The control method of claim 15, wherein the first electrical characteristic distribution and the second electrical characteristic distribution correspond to different digital values of the first bit of the data type.

17. The control method of claim 15, further comprising:
programming a first sub-distribution and a second sub-distribution of the first electrical characteristic distribution, and programming a third sub-distribution and a fourth sub-distribution of the second electrical characteristic distribution according to a second bit of the data type, wherein the first sub-distribution and the fourth sub-distribution correspond to a first digital value of the second bit, the second sub-distribution and the third sub-distribution correspond to a second digital value of the second bit.

18. The control method of claim 17, wherein a second overlapping area between the first sub-distribution and the second sub-distribution of the first electrical characteristic distribution is greater than the first overlapping area, a third overlapping area between the third sub-distribution and the fourth sub-distribution of the second electrical characteristic distribution is greater than the first overlapping area.

19. The control method of claim 18, wherein a ratio of the first overlapping area divided by a sum of the second overlapping area and the third overlapping area is equal to a ratio between error tolerance of the first bit and the second bit of the data type.

20. The control method of claim 17, wherein bits of the data type are divided into a first bit group and a second bit group, wherein error tolerance of each bits in the first bit group is lower than error tolerance of each bits in the second bit group,
   wherein the first bit is a bit from the first bit group and the second bit is a bit from the second bit group.

* * * * *